(12) United States Patent
Hirano et al.

(10) Patent No.: US 10,923,462 B2
(45) Date of Patent: Feb. 16, 2021

(54) BIFURCATED MEMORY DIE MODULE SEMICONDUCTOR DEVICE

(71) Applicant: Western Digital Technologies, Inc., San Jose, CA (US)

(72) Inventors: Toshiki Hirano, San Jose, CA (US); Gokul Kumar, San Jose, CA (US); Akio Nishida, Nagoya (JP); Yan Li, Milpitas, CA (US); Michael Mostovoy, San Ramon, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/021,529

(22) Filed: Jun. 28, 2018

(65) Prior Publication Data
US 2019/0341375 A1 Nov. 7, 2019

Related U.S. Application Data

(60) Provisional application No. 62/665,434, filed on May 1, 2018.

(51) Int. Cl.
*H01L 25/18* (2006.01)
*H01L 23/00* (2006.01)
(Continued)

(52) U.S. Cl.
CPC ............ *H01L 25/18* (2013.01); *H01L 21/561* (2013.01); *H01L 21/78* (2013.01); *H01L 22/14* (2013.01);
(Continued)

(58) Field of Classification Search
CPC ..... H01L 25/18; H01L 25/0657; H01L 25/50; H01L 25/0207; H01L 2924/1431;
(Continued)

(56) References Cited

U.S. PATENT DOCUMENTS 5,399,898 A * 3/1995 Rostoker ........... H01L 23/49503
257/499
8,415,808 B2 * 4/2013 Liao .................. H01L 23/49822
257/777

(Continued)

FOREIGN PATENT DOCUMENTS

| EP | 2102867 B1 | 7/2013 |
| KR | 20150085687 | 7/2015 |
| WO | 2014051729 A2 | 4/2014 |

OTHER PUBLICATIONS

Qiu et al., "Room-Temperature Cu Microjoining with Ultrasonic Bonding of Cone-Shaped Bump", Japanese Journal of Applied Physics, vol. 52, Apr. 22, 2013.
(Continued)

*Primary Examiner* — Joseph C. Nicely
(74) *Attorney, Agent, or Firm* — Vierra Magen Marcus LLP (57) ABSTRACT

A semiconductor device is disclosed including one or more integrated memory modules. Each integrated memory module may include a pair of semiconductor die, which together, operate as a single, integrated memory. In one example, the first die may include the memory cell array and the second die may include the logic circuit such as CMOS integrated circuits. In one example, the first die may be flip-chip bonded to the second die.

26 Claims, 11 Drawing Sheets

(51) Int. Cl.
*H01L 23/48* (2006.01)
*H01L 25/00* (2006.01)
*H01L 21/66* (2006.01)
*H01L 21/56* (2006.01)
*H01L 21/78* (2006.01)
*H01L 25/065* (2006.01)
*H01L 23/522* (2006.01)
*H01L 23/58* (2006.01)
*H01L 23/528* (2006.01)

(52) U.S. Cl.
CPC ............ *H01L 23/481* (2013.01); *H01L 24/05* (2013.01); *H01L 24/48* (2013.01); *H01L 25/0657* (2013.01); *H01L 25/50* (2013.01); H01L 23/528 (2013.01); H01L 23/5226 (2013.01); H01L 23/585 (2013.01); H01L 24/49 (2013.01); H01L 2224/04042 (2013.01); H01L 2224/48091 (2013.01); H01L 2224/48106 (2013.01); H01L 2224/48145 (2013.01); H01L 2224/48227 (2013.01); H01L 2224/49176 (2013.01); H01L 2225/0651 (2013.01); H01L 2225/06506 (2013.01); H01L 2225/06541 (2013.01); H01L 2225/06562 (2013.01); H01L 2924/1431 (2013.01); H01L 2924/1438 (2013.01); H01L 2924/14511 (2013.01)

(58) Field of Classification Search
CPC ..... H01L 2924/1438; H01L 2924/1451; H01L 2924/1434; H01L 24/05; H01L 23/481; H01L 2224/48145
See application file for complete search history.

(56) References Cited

U.S. PATENT DOCUMENTS

| | | |
|---|---|---|
| 8,947,931 B1 | 2/2015 | D'Abreu |
| 9,129,846 B2 * | 9/2015 | Song .................... H01L 25/105 |
| 9,478,487 B2 | 10/2016 | Yang et al. |
| 9,761,568 B2 | 9/2017 | Fang et al. |
| 10,249,587 B1 | 4/2019 | Chen et al. |
| 2005/0263869 A1 | 12/2005 | Tanaka et al. |
| 2006/0138647 A1 | 6/2006 | Crisp et al. |
| 2006/0261454 A1 | 11/2006 | Takiar et al. |
| 2008/0001305 A1 * | 1/2008 | Uchida ............... H01L 25/0657 257/777 |
| 2009/0004776 A1 | 1/2009 | Ye et al. |
| 2011/0161583 A1 | 6/2011 | Youn |
| 2013/0028021 A1 * | 1/2013 | Sharon ................ G11C 11/5642 365/185.17 |
| 2013/0093080 A1 | 4/2013 | Han et al. |
| 2013/0277831 A1 | 10/2013 | Yoon et al. |
| 2014/0375137 A1 * | 12/2014 | Ichikawa ............. H04B 5/0037 307/104 |
| 2015/0102506 A1 * | 4/2015 | Song ...................... H01L 24/05 257/777 |
| 2015/0294958 A1 | 10/2015 | Mallik et al. |
| 2016/0155724 A1 | 6/2016 | Kim et al. |
| 2017/0256501 A1 | 9/2017 | Chao et al. |
| 2017/0323682 A1 | 11/2017 | Tran et al. |

OTHER PUBLICATIONS

International Search Report and Written Opinion dated Jun. 10, 2019 in International Patent Application No. PCT/US2019/019127.
Notice of Allowance and Fees Due dated Aug. 26, 2019 in U.S. Appl. No. 16/021,616.
English language Abstract for KR20150085687 published Jul. 24, 2015.
International Search Report and Written Opinion dated Jun. 10, 2019 in International Patent Application No. PCT/US2019/019136.

* cited by examiner

BIFURCATED MEMORY DIE MODULE SEMICONDUCTOR DEVICE

PRIORITY CLAIM

The present application claims priority to U.S. Provisional Patent Application No. 62/665,434, filed on May 1, 2018, entitled "BIFURCATED MEMORY DIE MODULE SEMICONDUCTOR DEVICE," which application is incorporated by reference herein in its entirety.

BACKGROUND

The strong growth in demand for portable consumer electronics is driving the need for high-capacity storage devices. Non-volatile semiconductor memory devices, such as flash memory storage cards, are widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

Recently, ultra high density memory devices have been proposed using a 3D stacked memory structure having strings of memory cells formed into layers. One such storage device is sometimes referred to as a Bit Cost Scalable (BiCS) architecture. In addition to the layered memory cells, 3D memory devices include a logic circuit for controlling read/write to the memory cells. The logic circuit, often fabricated using complementary metal-oxide-semiconductor (CMOS) technology, may typically be formed beneath stacked memory layers within a semiconductor wafer.

As the number of memory layers in 3D memory structures increases to meet ever growing memory demands, it is becoming harder to position the logic circuit beneath the 3D memory cell structure. Additionally, it is known to anneal the 3D memory cell structure with heat. While advantageous for the memory cell structure, the heat can adversely affect the operation of the logic circuit.

DETAILED DESCRIPTION

The present technology will now be described with reference to the figures, which in embodiments, relate to a semiconductor device including one or more integrated memory modules. Each integrated memory module may include a pair of semiconductor die, which together, operate as a single, integrated memory. The division of the memory functionality between the pair of die in the module may vary in embodiments, but in one example, the first die may include the memory cell array and the second die may include the logic circuit such as CMOS integrated circuits.

In embodiments, the second semiconductor die of the integrated memory module may be smaller than the first die, and may be flip-chip bonded to a surface of the first die, adjacent a row of die bond pads on the first die. With such a configuration, a number of such integrated memory modules may be stacked on top of each other in an offset stepped configuration in such a way that the second die of each integrated memory module does not factor into an overall height of the stack.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation. Also, as used herein, the terms "substantially" and/or "about" mean that the specified dimension or parameter may be varied within an acceptable manufacturing tolerance for a given application.

In one embodiment, the acceptable manufacturing tolerance is ±2.5% of a given dimension.

Figure 1:
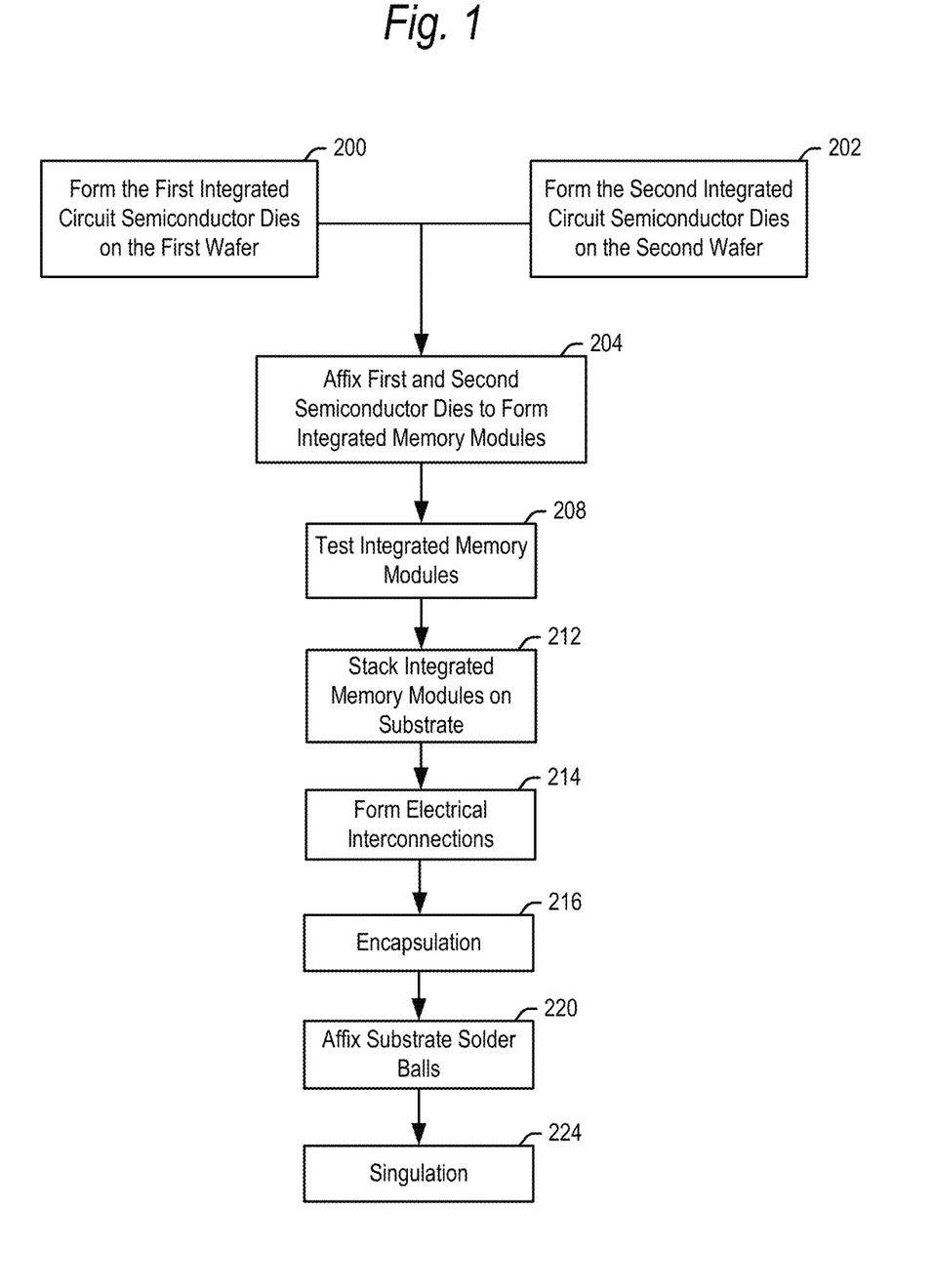
FIG. 1 is a flowchart for forming a semiconductor die device according to embodiments of the present technology.
Figure 2:
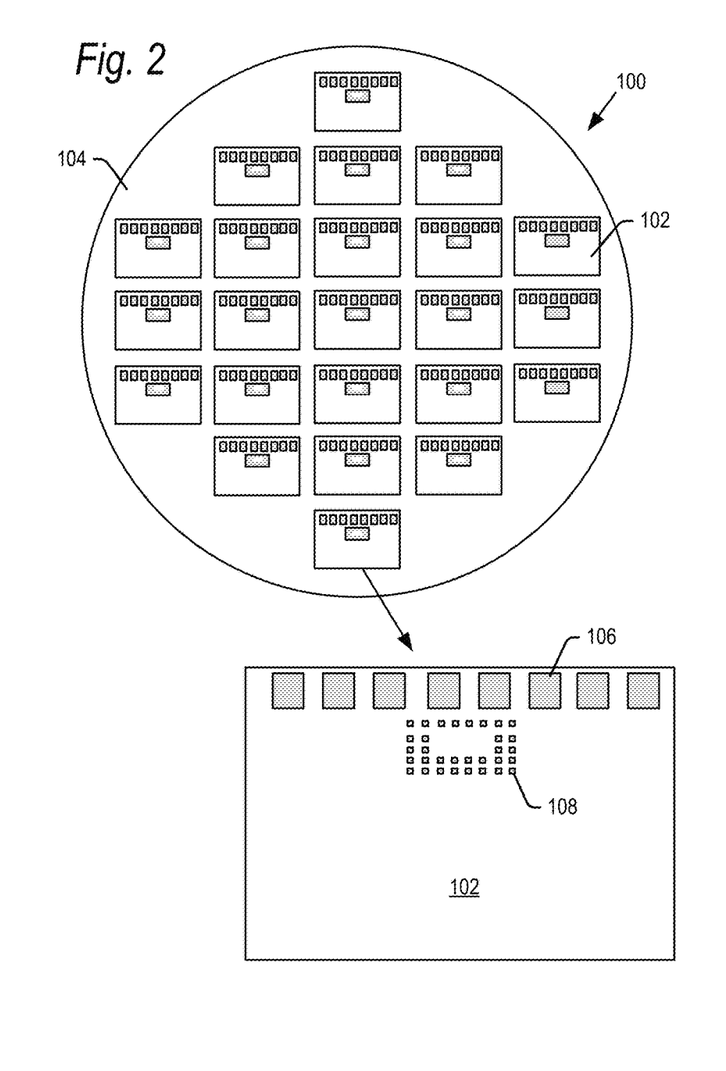
FIG. 2 is a top view of a first major surface of a first semiconductor wafer, and a first semiconductor die therefrom, according to embodiments of the present technology.

An embodiment of the present technology will now be explained with reference to the flowchart of FIG. 1, and the views of FIGS. 2-21. In step 200, a first semiconductor wafer 100 may be processed into a number of first semiconductor dies 102 as shown in FIG. 2. The first semiconductor wafer 100 may start as an ingot of wafer material which may be monocrystalline silicon grown according to either a Czochralski (CZ) or floating zone (FZ) process. However, first wafer 100 may be formed of other materials and by other processes in further embodiments.

The semiconductor wafer 100 may be cut from the ingot and polished on both the first major surface 104, and second major surface (not shown) opposite surface 104, to provide smooth surfaces. The first major surface 104 may undergo various processing steps to divide the wafer 100 into the respective first semiconductor dies 102, and to form integrated circuits of the respective first semiconductor dies 102 on and/or in the first major surface 104. These various processing steps may include metallization steps depositing metal contacts including die bond pads 106 and flip-chip bond pads 108 exposed on the first major surface 104. The metallization steps may further include depositing metal interconnect layers and vias within the wafer. These metal interconnect layers and vias may be provided for transferring signals to and from the integrated circuits, and to provide structural support to the integrated circuits as explained below with respect to FIGS. 6-7.

The number of first semiconductor dies 102 shown on wafer 100 in FIG. 2 is for illustrative purposes, and wafer 100 may include more first semiconductor dies 102 than are shown in further embodiments. Similarly, the number of bond pads 106, 108 on the first semiconductor die 102 are shown for illustrative purposes, and each first die 102 may include more bond pads 106, 108 than are shown in further embodiments.

In one embodiment, the first semiconductor dies 102 may be processed to include integrated circuit memory cells, such as for example one or more 3D stacked memory cell arrays having strings of NAND memory. The first semiconductor dies 102 may include other and/or additional circuits in further embodiments as explained below.

Figure 3:
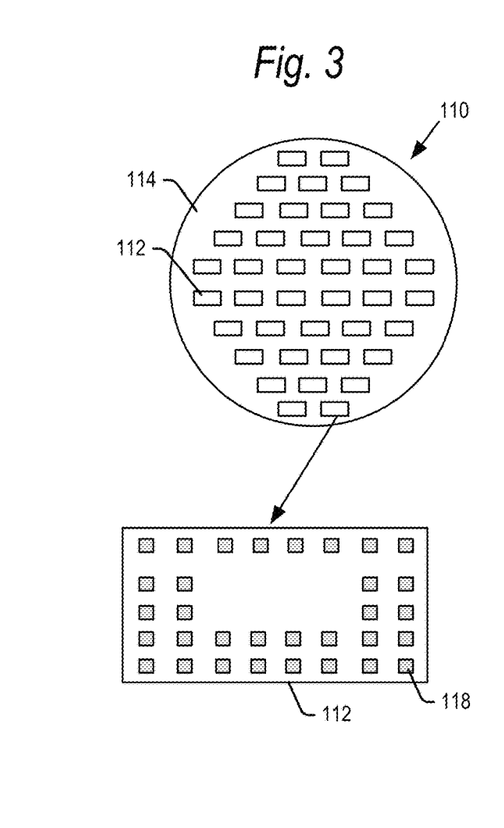
FIG. 3 is a top view of a first major surface of a second semiconductor wafer, and a second semiconductor die therefrom, according to embodiments of the present technology.

Before, after or in parallel with the formation of the first semiconductor dies on wafer 100, a second semiconductor wafer 110 may be processed into a number of second semiconductor dies 112 in step 202 as shown in FIG. 3. The semiconductor wafer 110 may start as an ingot of monocrystalline silicon grown according to either a CZ, FZ or other process. The second semiconductor wafer 110 may be cut and polished on both the first major surface 114, and second major surface (not shown) opposite surface 114, to provide smooth surfaces. The first major surface 114 may undergo various processing steps to divide the second wafer 110 into the respective second semiconductor dies 112, and to form integrated circuits of the respective second semiconductor dies 112 on and/or in the first major surface 114. These various processing steps may include metallization steps depositing metal contacts including flip-chip bond pads 118 exposed on the first major surface 114. The metallization steps may further include depositing metal interconnect layers and vias within the wafer. These metal interconnect layers and vias may be provided for transferring signals to and from the integrated circuits as explained below with respect to FIGS. 6-7.

The number of second semiconductor dies 112 shown on wafer 110 in FIG. 3 is for illustrative purposes, and wafer 110 may include more second semiconductor dies 112 than are shown in further embodiments. Similarly, the number of flip-chip bond pads 118 on the second semiconductor die 112 is shown for illustrative purposes, and each second die 112 may include more bond pads 118 than are shown in further embodiments.

In one embodiment, the second semiconductor dies 112 may be processed to include integrated logic circuits, configured to control read/write operations for one or more integrated memory cell arrays. The logic circuits may be fabricated using CMOS technology, though the logic circuits may be fabricated using other technologies in further embodiments. The second semiconductor dies 112 may include other and/or additional circuits in further embodiments as explained below.

Figure 4:
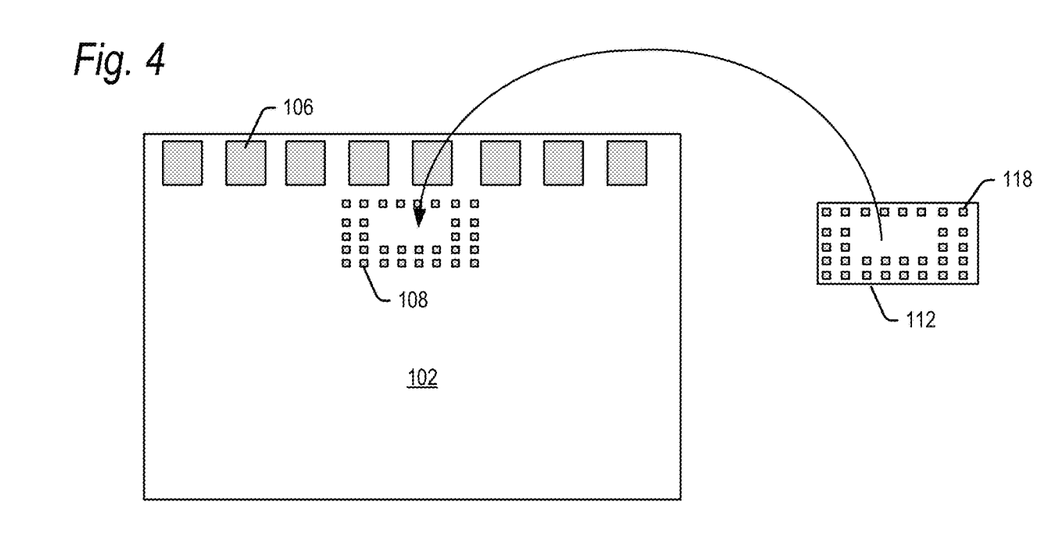
FIG. 4 is a top view showing assembly of the first and second semiconductor die into an integrated memory module according to embodiments of the present technology.
Figure 5:
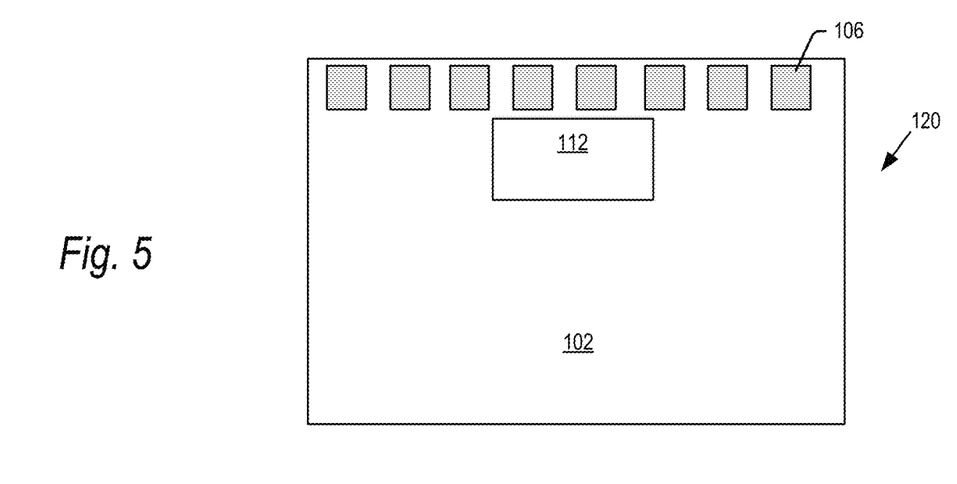
FIG. 5 is a top view of a completed integrated memory module according to embodiments of the present technology.

In step 204, first semiconductor dies 102 diced from wafer 100 and second semiconductor dies diced from wafer 110 may be physically and electrically coupled to each other as shown in FIGS. 4 and 5. In one embodiment, the pattern of flip-chip bond pads 108 on first semiconductor die 102 may match the pattern of flip-chip bond pads 118 on second semiconductor die 112 as shown in FIG. 4. The particular patterns of bond pads 108, 118 shown in FIG. 4 is by way of example only and may vary in further embodiments. The second semiconductor die 112 may be flipped over, and respective bond pads 118 may be physically and electrically coupled to respective bond pads 108 using heat and pressure to reflow a solder bump 146 (FIG. 6) at each bond pad interface.

Once coupled together, the first and second semiconductor dies 102, 112 together form an integrated memory module 120 as shown in FIG. 5. In accordance with aspects of the present technology, the integrated memory module 120 functions as a single, complete memory, such as for example a BiCS flash memory. It is understood that the integrated memory module 120 may function as other types of flash memory, including 2D memories and other 3D memories, as well as other types of memories. Such other types of memories include, but are not limited to, Magnetic RAM, Resistive RAM, Phase-change RAM, etc.

Forming the integrated memory module 120 from two separate semiconductor dies has several advantages over conventional memory dies formed of a single die. For example, where the first die 102 includes a memory cell array, removal of the logic circuit from the first die frees up valuable space for additional memory cells. For example, if memory cells and logic circuits are made on a wafer in "side-by-side" configuration, removal of the logic circuit allows additional area to be provided for the memory stack.

Moreover, separation of the memory cells and the logic circuits into two separate wafers allows the fabrication processes for both wafers to be customized and optimized for the particular integrated circuits formed on the respective wafers. For example, conventional processes for forming flash memory integrated circuits involved a heat step which could be detrimental to the CMOS logic circuits. By fabricating the logic circuits on their own wafer, this problem may be alleviated.

Referring again to FIG. 5, the second semiconductor die 112 of integrated memory module 120 may be significantly smaller than the first semiconductor die 102. As such, the overall footprint of the integrated memory module 120 may be determined exclusively by the footprint of the first semiconductor die 102. That is, the size of the second semiconductor die 112 does not increase or otherwise affect the footprint of the integrated memory module 120. As explained below, the relative sizes of the first and second semiconductor dies 102, 112 may vary from that shown in FIG. 5. In one further example, the second semiconductor die 112 may cover the entire surface of the first semiconductor die 102, with the exception that the die bond pads 106 of the first semiconductor die 102 be left exposed and uncovered by the second semiconductor die 112.

In the embodiments shown in FIGS. 4-5, the first and second semiconductor dies 102, 112 include a pattern of bond pads for flip-chip bonding of the dies. It is understood that the first and second semiconductor dies 102, 112 may be electrically coupled to each other using other schemes in further embodiments. In one such further embodiment, the first and second semiconductor dies 102, 112 may be electrically coupled to each other using through-silicon vias (TSV). In another such embodiment, the first and second semiconductor dies 102, 112 may be wire bonded to each other. The flip-chip bond pads 108, 118 may be omitted in such alternative embodiments.

Figure 6:
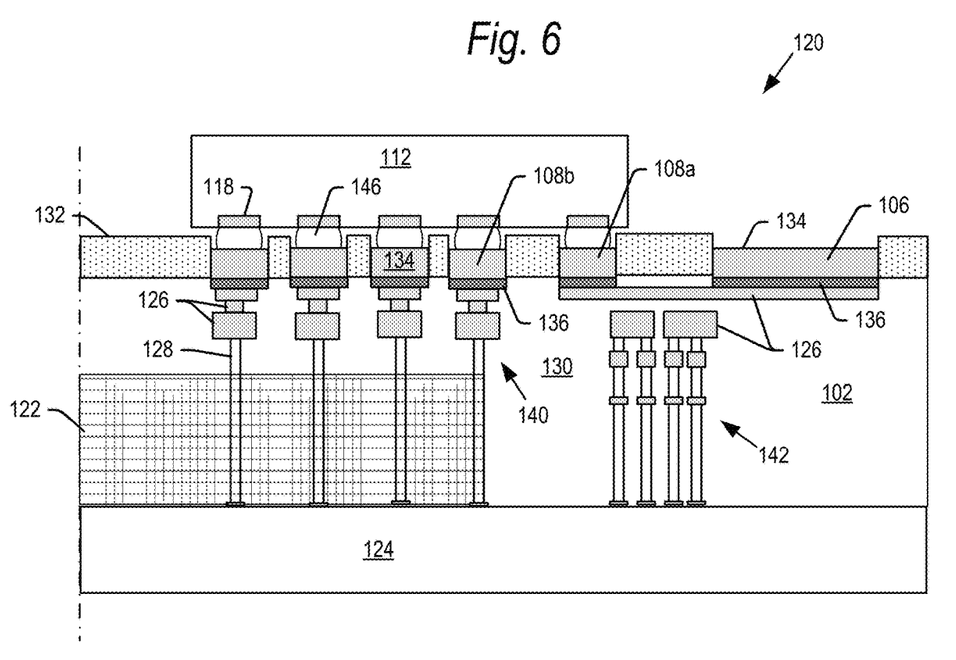
FIGS. 6 and 7 are cross-sectional edge and top views showing an integrated memory module according to embodiments of the present technology.

Additional details relating to the physical and electrical coupling of the first and second semiconductor dies 102, 112 will now be explained with reference to the cross-sectional edge view and top view of FIGS. 6 and 7, respectively. First semiconductor die 102 may include memory cell array 122 formed in and/or on a substrate layer 124 within a chip region of the semiconductor die 102. As noted, the memory cell array 122 may be formed as a 3D stacked memory structure having strings of memory cells formed into layers. After formation of the memory cell array 122, multiple layers of metal interconnects 126 and vias 128 may be formed sequentially in layers of a dielectric film 130. As is known in the art, the metal interconnects 126, vias 128 and dielectric film layers 130 may be formed a layer at a time using photolithographic and thin-film deposition processes. The photolithographic processes may include for example pattern definition, plasma, chemical or dry etching and polishing. The thin-film deposition processes may include for example sputtering and/or chemical vapor deposition. The metal interconnects 126 may be formed of a variety of electrically conductive metals including for example copper and copper alloys as is known in the art, and the vias 128 may be lined and/or filled with a variety of electrically conductive metals including for example tungsten, copper and copper alloys as is known in the art.

A passivation layer 132 may be formed on top of the upper dielectric film layer 130. The passivation layer 132 may be etched to form the bond pads 106, 108. Each bond pad 106, 108 may include a contact layer 134 formed over a liner 136. As is known in the art, the contact layer 134 may be formed for example of copper, aluminum and alloys thereof, and the liner 136 may be formed for example of a titanium/titanium nitride stack such as for example Ti/TiN/Ti, though these materials may vary in further embodiments. The bond pads 106, 108 (contact layer plus liner) may have a thickness of 720 nm, though this thickness may be larger or smaller in further embodiments.

The metal interconnects 126 and vias 128 may be used to form conductive nodes 140 as is known in the art within the chip region for transferring signals and voltages between the die bond pads 108 and integrated circuits 122. In accordance with aspects of the present technology, metal interconnects 126 may be used to electrically interconnect die on bond pads 106 with a first group of the flip-chip bond pads 108 (bond pads 108a in FIG. 6). Thus, as explained below, signals, for example from a memory controller, may be transferred to/from the second semiconductor die 112 via the die bond pads 106 and the first group of flip-chip bond pads 108a on first die 102. Signals may also be transferred between the first die 102 and second die 112 via a second group of flip-chip bond pads (bond pads 108b in FIG. 6). While FIG. 6 shows the die bond pads 106 electrically interconnected with single row of flip-chip bond pads 108a, it is conceivable that the die bond pads 106 be electrically interconnected with more than one row of flip-chip bond pads 108a, or less than an entire row of flip-chip bond pads 108a.

The metal interconnects 126 and vias 128 may also be used to form a seal ring 142 as is known in the art within a seal ring area. The seal ring 142 may surround the integrated circuits 122 and conductive nodes 140, and provide mechanical support to prevent damage to the integrated circuits 122 and conductive nodes 140 for example during dicing of the wafer 100.

Although shown without detail, the second semiconductor die 112 may be formed in a similar way to include integrated circuits (though, in examples, substituting the logic circuit for the memory cell array). As with first dies 102, the integrated circuits in second die 112 may be electrically interconnected with the flip-chip bond pads 118 of the second die 112 via a framework of metal interconnects and vias.

Figure 7:
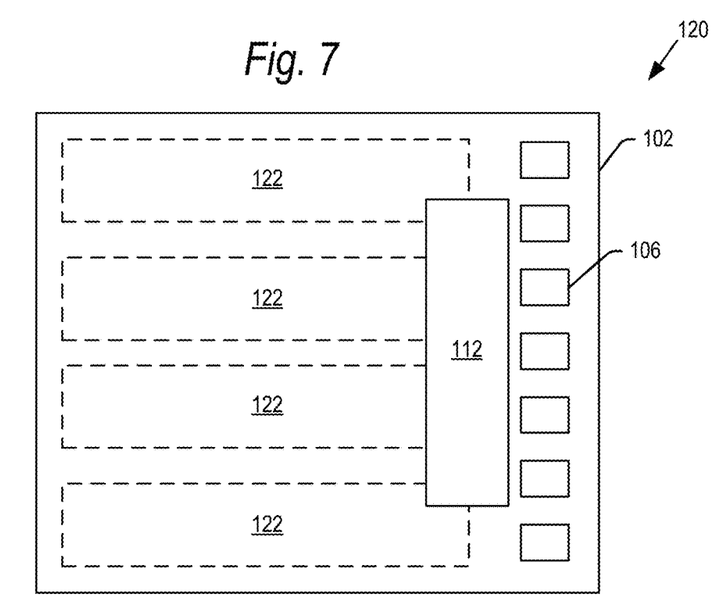

FIG. 7 shows a further top view of an integrated memory module 120 including the first and second dies 102, 112. In embodiments where the first die 102 includes integrated circuits 122 configured as memory cell arrays, the second semiconductor die 112 may overlie portions of the memory cell arrays in integrated memory module 120.

Figure 8:
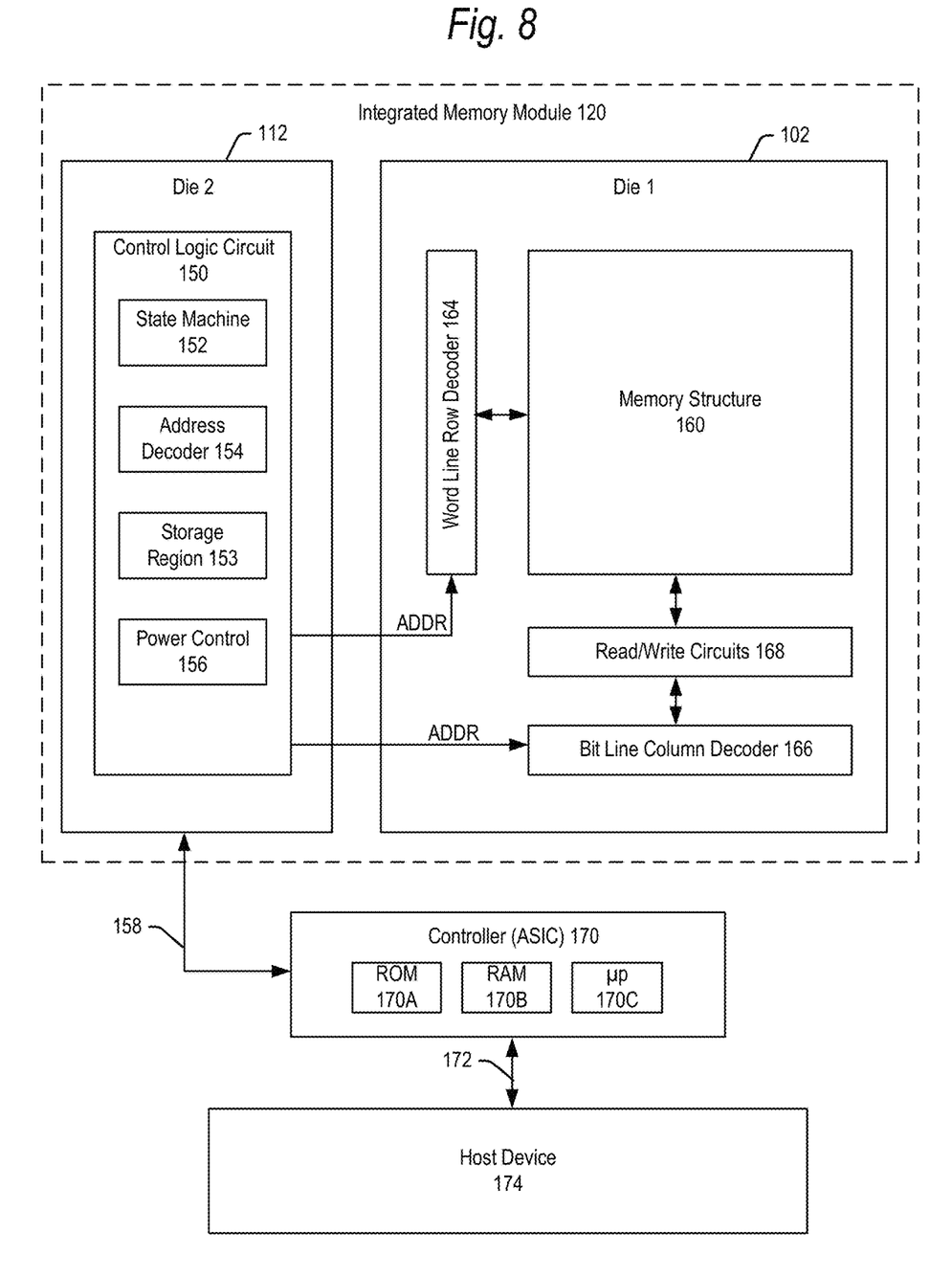
FIG. 8 is a functional block diagram of an integrated memory module coupled to a host device via a controller according to embodiments of the present technology.

As noted, in embodiments the first semiconductor die 102 may include memory cell arrays and the second semiconductor die 112 may include control logic circuitry so that the integrated memory module 120 may function as a single, complete memory. In accordance with aspects of the present technology, the memory is bifurcated into two separate semiconductor die which are assembled together. FIG. 8 is a functional block diagram showing further detail of an embodiment where the first die includes memory cell arrays and the second die 112 includes a logic circuit.

The first die 102 of the integrated memory module 120 may include a memory structure 160 of memory cells, such as an array of memory cells, and read/write circuits 168. The second die 112 may include control logic circuitry 150. The memory structure 160 is addressable by word lines via a row decoder 164 and by bit lines via a column decoder 166. The read/write circuits 168 may include multiple sense blocks (sensing circuitry) that allow a page of memory cells to be read or programmed in parallel.

Multiple memory elements in memory structure 160 may be configured so that they are connected in series or so that each element is individually accessible. By way of non-limiting example, flash memory systems in a NAND configuration (NAND memory) typically contain memory elements connected in series. A NAND string is an example of a set of series-connected transistors comprising memory cells and select gate transistors.

A NAND memory array may be configured so that the array is composed of multiple strings of memory in which a string is composed of multiple memory elements sharing a single bit line and accessed as a group. Alternatively, memory elements of memory structure 160 may be configured so that each element is individually accessible, e.g., a NOR memory array. NAND and NOR memory configurations are exemplary, and memory elements may be otherwise configured.

The memory structure 160 can be two-dimensional (2D) or three-dimensional (3D). The memory structure 160 may comprise one or more arrays of memory elements (also referred to as memory cells). A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate 124, FIG. 6).

The memory structure 160 on the first die 102 may be controlled by control logic circuit 150 on the second die 112. The control logic circuit 150 may have circuitry used for controlling and driving memory elements to accomplish functions such as programming and reading. The control circuitry 150 cooperates with the read/write circuits 168 to perform memory operations on the memory structure 160. In embodiments, control circuitry 150 may include a state machine 152, an on-chip address decoder 154, and a power control module 156. The state machine 152 provides chip-level control of memory operations. A storage region 153 may be provided for operating the memory structure 160 such as programming parameters for different rows or other groups of memory cells. These programming parameters could include bit line voltages and verify voltages.

The on-chip address decoder 154 provides an address interface between that used by the host device or the memory controller (explained below) to the hardware address used by the decoders 164 and 166. The power control module 156 controls the power and voltages supplied to the word lines and bit lines during memory operations. It can include drivers for word line layers in a 3D configuration, source side select gates, drain side select gates and source lines. A source side select gate is a gate transistor at a source-end of a NAND string, and a drain side select gate is a transistor at a drain-end of a NAND string.

In accordance with aspects of the present technology, the above-described components of integrated memory module 170 are bifurcated into two separate semiconductor dies 102 and 112, one example of which dies 102, 112 are shown in FIG. 8. However, it is understood that the division of the above-described components between the two different dies 102, 112 may vary from that shown in FIG. 8. Some or all of the components shown and described above as being part of die 102 may be provided on die 112, while some or all of the components shown and described above as being part of die 112 may be provided on die 102. Additional components may be added to either die 102 or die 112 in further embodiments. In embodiments, the control logic circuit 150 may include the components shown in FIG. 8 and described above. In further embodiments, all components other than the memory cells 160 can be thought of as one or more control logic circuits which are configured to perform the actions described herein. For example, one or more control logic circuits may include any one of, or a combination of, control circuitry 150, state machine 152, decoders 154/164/166, power control module 156, the sense blocks of read/write circuits and so forth.

Data and commands may be transferred to and from the integrated circuit module 120 by a memory controller 170. The memory controller 170 may for example comprise an ASIC, and may be processed on a semiconductor die that is separate from dies 102 and 112. In further embodiments, the memory controller 170 may be incorporated into one of the dies 102, 112, such as for example on die 112. The memory controller 170 may comprise a processor such as a microprocessor 170c, and storage devices (memory) such as read only memory (ROM) 170a and RAM 170b. RAM 170b may be, but is not limited to, SRAM and DRAM. The storage devices comprise code such as a set of instructions, and the processor is operable to execute the set of instructions to provide the functionality described herein. Alternatively or additionally, the processor can access code from a storage device region of the memory structure 160, such as a reserved area of memory cells in one or more word lines.

The code is used by the memory controller 170 to access the memory structure 160 such as for programming, read and erase operations. The code can include boot code and control code (e.g., a set of instructions). The boot code is software that initializes the memory controller 170 during a booting or startup process and enables the memory controller to access the memory structure 160. Upon being powered up, the processor 170c fetches the boot code from the ROM 170a or the storage device region of memory structure 160 for execution, and the boot code initializes the system components and loads the control code into the RAM 170b. Once the control code is loaded into the RAM 170b, it is executed by the processor 170c. The control code includes drivers to perform basic tasks such as controlling and allocating memory, prioritizing the processing of instructions, and controlling input and output ports.

The memory controller 170 controls communication between the integrated memory module 120 and a host device 174. The host device may for example be a printed circuit board to which the integrated memory module 120 and/or memory controller 162 are mounted. The host device may alternatively be a computing system. Commands and data are transferred between the host device 174 and memory controller 170 via an interface (e.g., data bus) 172 and between the memory controller and the integrated memory module 120 via line 158. The interface 172 between the host device 174 and the memory controller 170 may comprise a Peripheral Component Interconnect Express (PCIe) bus, but the interface 172 is not limited to a PCIe bus.

Referring again to FIG. 1, after the first and second dies 102, 112 are formed and coupled to each other to form integrated memory module 120, the memory module 120 may be tested in step 208 as is known, for example with read/write and burn in operations.

Figure 9:
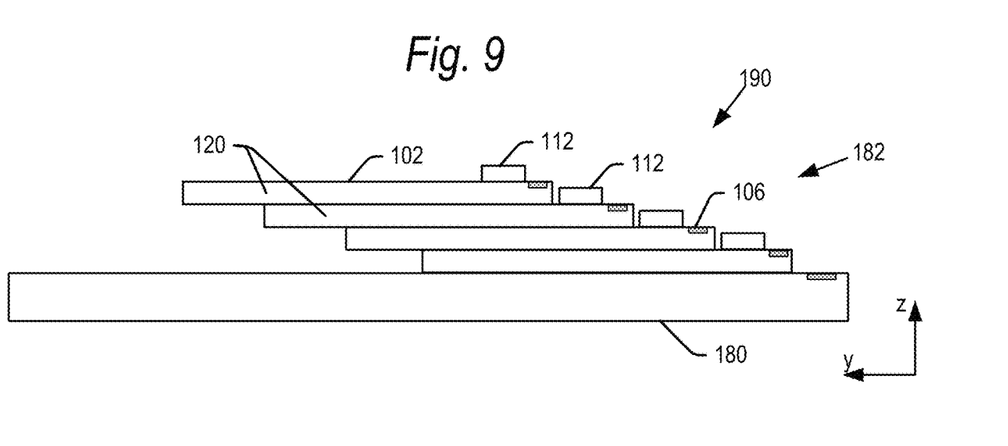
FIG. 9 is an edge view of a portion of a semiconductor device including a number of stacked integrated memory modules according to embodiments of the present technology.

In step 212, two or more integrated memory modules may be stacked on a substrate 180 as shown in the edge view of FIG. 9. The substrate may be any of various chip-carrying media including conductive pads, electrical traces and vias for transferring data and commands between the stacked integrated memory modules 120 and a host device such as host device 174 described above. Such chip carrier media may include but are not limited to a printed circuit board (PCB), a leadframe or a tape automated bonded (TAB) tape. Passive components (not shown) may be mounted to the substrate either before or after the integrated memory modules 120. The passive components may include for example one or more capacitors, resistors and/or inductors, though other components are contemplated.

The integrated memory modules 120 may be mounted on each other in the z-direction so as to form a die stack 182 on the substrate 180 as shown in the edge view of FIG. 9. While 4 memory modules 120 are shown in the figures, there may be 1, 2, 4, 8, 16, 32, 64 or other numbers of memory modules 120 in different embodiments. Once electrically interconnected and encapsulated as explained below, the substrate 180 and die stack 182 may form a completed semiconductor device 190.

In accordance with aspects of the present technology, the integrated memory modules 120 may be stacked on each other in such a way that the second die 112 of each module 120 does not add to or otherwise affect the overall height required in the semiconductor device 190 for the die stack 182. In particular, the integrated memory modules 120 may be mounted on each other in stack 182 in an offset stepped configuration where the first semiconductor die 102 of a memory module 120 is affixed directly to the first semiconductor die 102 of the memory module 120 immediately below it.

The memory modules 120 may be offset spaced from each other in the y-direction a distance so that the first die 102 of a stacked memory module sits next to the second die 112 of a memory module immediately below it. That is, where an upper memory module 120 is mounted on a lower memory module 120, both the upper memory module 120 and the second die 112 of the lower memory module 120 are mounted directly to the surface of the first die 102 of the lower memory module 120. The second die 112 may have a thickness that is less than or equal to the first die 102. Thus, the second die 112 of each module 120 does not add to the overall height required in the semiconductor device 190 for the die stack 182. The memory modules 120 may be stacked on each other using a die attach film (DAF) on a bottom surface of each of the first die 102.

The second die 112 of the lower memory module may sit between, and be slightly spaced in the y-direction from, the die bond pads 106 in the lower memory module and the upper memory module mounted thereon. In one embodiment, a second die 112 may be spaced 20 μm to 50 μm from the adjacent die bond pads 106, and 20 μm to 50 μm from the first die 102 of the next module 120 stacked thereon. These distances are by way of example and may vary in further embodiments.

Once the die stack 182 is formed, the die stack 182 may be electrically coupled to each other and the substrate 180 in a step 214. As shown in the edge view of FIG. 10 and the perspective view of FIG. 11, wire bonds 192 may be formed down the stepped edge of the die stack 182, between aligned die bond pads 106 on the first dies 102 of the integrated memory modules 120 in stack 182. Wire bonds 192 may also be used to electrically connect the die stack 182 to the contact pads 194 on substrate 180. Wire bonds may be used to electrically connect the aligned die bond pads 106 on respective memory modules 120 to each other and to substrate 180, thus allowing signal transfer between the substrate and the memory modules 120 in stack 182.

Figure 10:
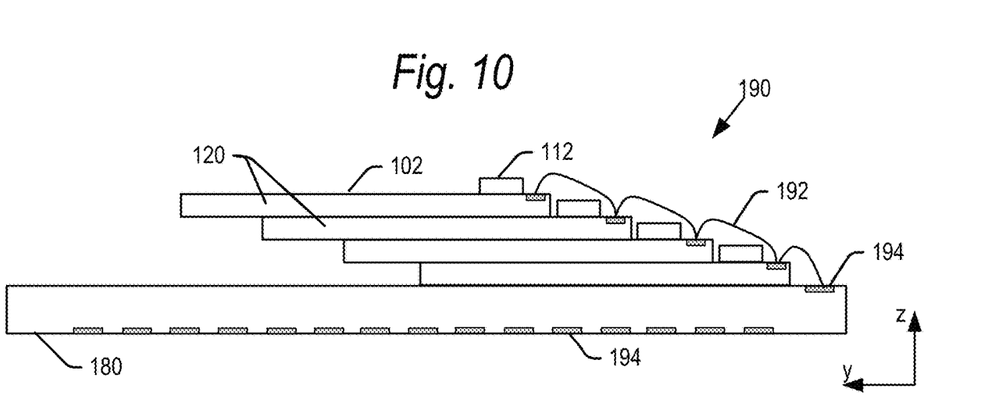
FIG. 10 is an edge view of a portion of a semiconductor device including a number of stacked and wire bonded integrated memory modules according to embodiments of the present technology.
Figure 11:
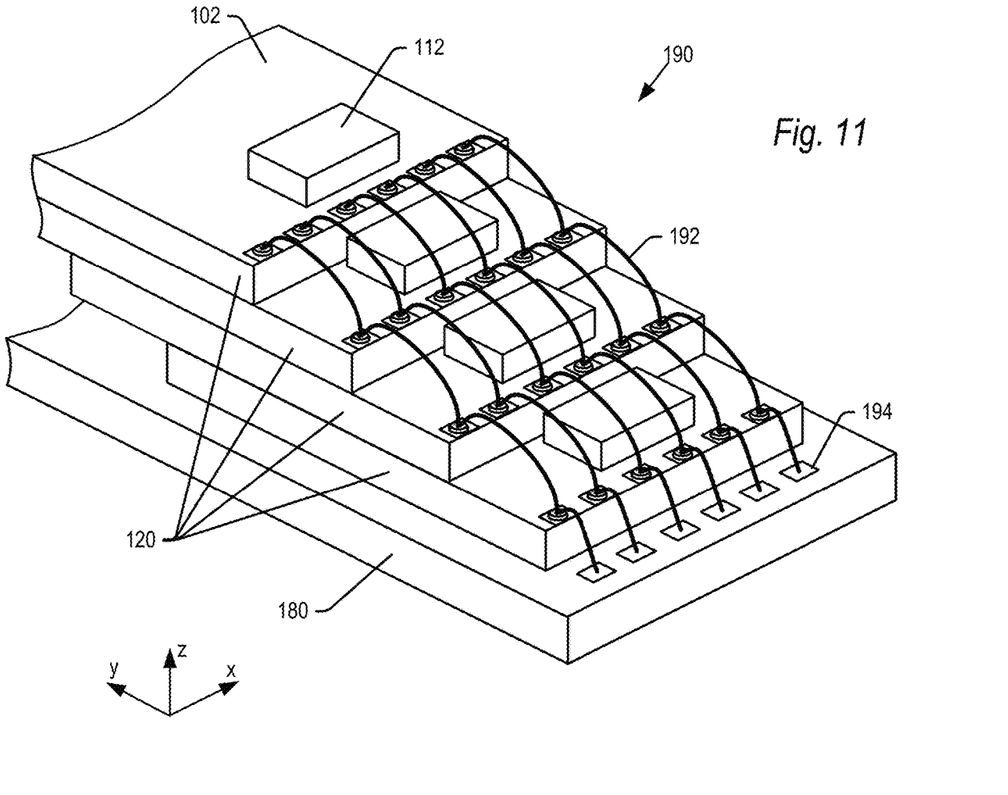
FIG. 11 is a perspective view of a portion of a semiconductor device including a number of stacked and wire bonded integrated memory modules according to embodiments of the present technology.

As seen in FIGS. 10 and 11, it is a feature of the present technology that the wire bonds may extend between contact pads 106 at different levels over the second die 112 in each module 120 (except the top module). Thus, the second dies 112 may be provided in a space that is otherwise unused.

In one embodiment, the wire bonds 192 may be formed using ball bonds, though other types of bonds are contemplated. The wire bonds 192 may be formed of gold, gold alloy or other materials. The wire bonds 130 are shown generally in a straight vertical column from one layer of die to the next in the die stack 182, and to the substrate 180. However, one or more of the wire bonds may extend diagonally from one die to the next in alternative embodiments. Further, it may be that a wire bond skips one or more layers in the die stack 182. The number of wire bonds 192 shown in FIG. 11 is by way of example only, and there may be more wire bonds in further embodiments.

Figure 12:
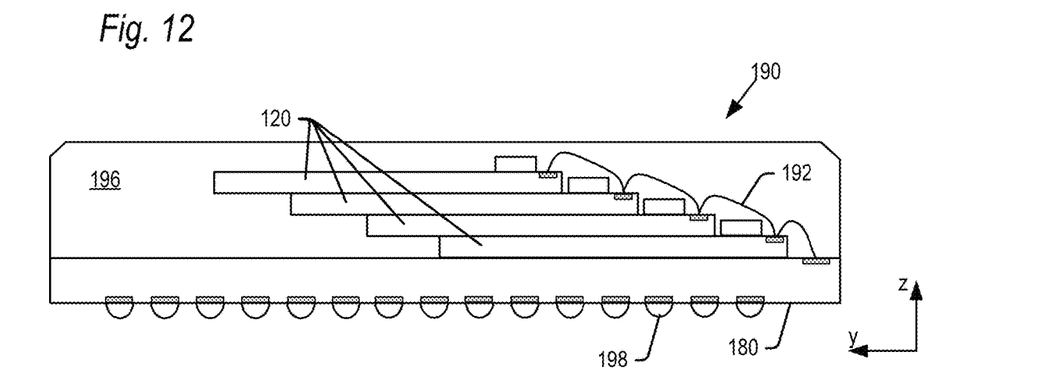
FIG. 12 is an edge view of a completed semiconductor device including a number of stacked and wire bonded integrated memory modules according to embodiments of the present technology.

After the wire bonds 192 are formed, the semiconductor device 190 may be encapsulated in a mold compound 196 in step 216 and as shown in FIG. 12. Mold compound 196 may include for example solid epoxy resin, Phenol resin, fused silica, crystalline silica, carbon black and/or metal hydroxide. Such mold compounds are available for example from Sumitomo Corp. and Nitto-Denko Corp., both having headquarters in Japan. Other mold compounds from other manufacturers are contemplated. The mold compound may be applied by a FFT (Flow Free Thin) process or by other known processes, including by transfer molding or injection molding techniques.

In step 220, solder balls 198 (FIG. 12) may optionally be affixed to the contact pads 194 on a lower surface of substrate 180 of the semiconductor device 190. The solder balls 198 may be used to affix the semiconductor device 190 to a host device 174 (FIG. 8) such as a printed circuit board. Solder balls 198 may be omitted where the semiconductor device 190 is to be used as an LGA package.

In order to take advantage of economies of scale, multiple semiconductor devices 190 may be formed simultaneously on a panel of substrates 180. After formation and encapsulation of the devices 190 on the panel, the devices 190 may be singulated from each other in step 224 to form a finished semiconductor device 190 as shown in FIG. 12. The semiconductor devices 190 may be singulated by any of a variety of cutting methods including sawing, water jet cutting, laser cutting, water guided laser cutting, dry media cutting, and diamond coating wire cutting. While straight line cuts will define generally rectangular or square shaped semiconductor devices 190, it is understood that semiconductor device 190 may have shapes other than rectangular and square in further embodiments of the present technology.

Figure 13:
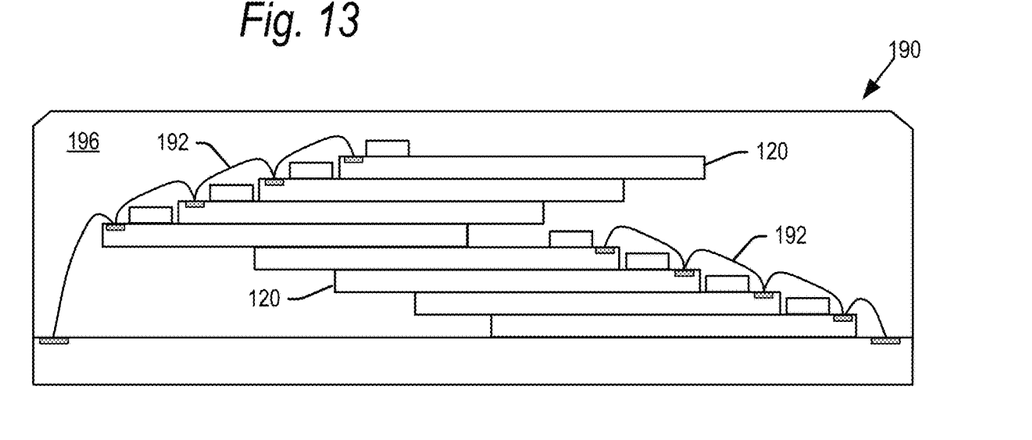
FIGS. 13-15 are perspective views of semiconductor devices according to alternative embodiments of the present technology.

In the embodiments described above, the die stack 182 may be stepped in a single direction. FIG. 13 shows an alternative embodiment, where the die stack 182 includes a first group of integrated memory modules 120 offset in a first stepped direction and a second group of integrated memory modules 120 offset in a second stepped direction opposite the first stepped direction. While the first and second groups are shown as including four memory modules 120 each, there may be fewer or greater than four memory modules 120 in the first and/or second groups. Both groups of integrated memory modules 120 may be coupled to each other and the substrate as shown using wire bonds 192. The memory modules 120 in the first and second groups are mounted so that the first die 102 of each memory module is stacked on the first die 102 of the memory module immediately below it.

Figure 14:
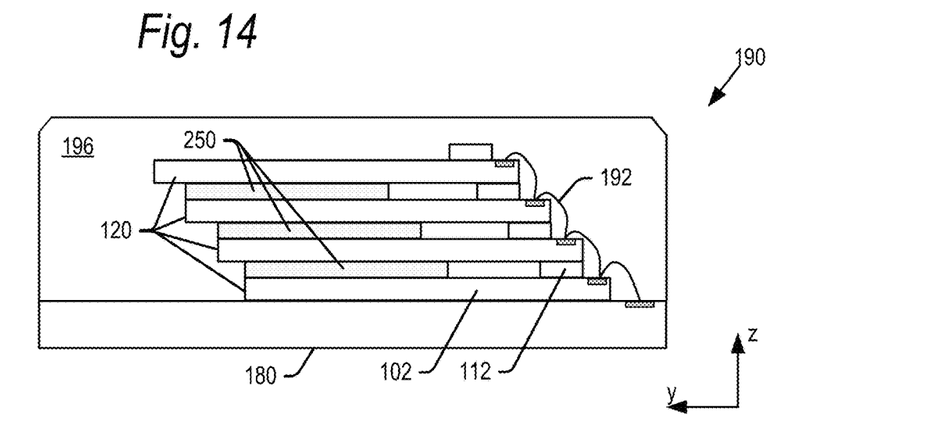

In embodiments described above, the second die 112 and the first die 102 of the next higher memory module 120 are both affixed to the first die 102 of the lower memory module 120. However, other configurations of die in die stack 182 are contemplated. FIG. 14 shows one further embodiment where memory modules are stacked on top of each other such that the first die 102 is mounted on top of the second die 112 of the next lower memory module 120.

In the embodiment of FIG. 14, spacers 250 may be provided next to the second die 112 of all memory modules except the top memory module 120 in the stack 182. The spacers 250 may be formed of a gel or film, or may be a dielectric solid such as silicon dioxide. The memory modules 120 may be stacked in an offset stepped configuration. However, as there is no need to leave space for the second die 112, the offset in this embodiment may be smaller than in the embodiments described for example with respect to FIGS. 10 and 11. The offset may be large enough to expose the die bond pads 106 on the first die 102 of each memory module 120.

In embodiments described above, multiple integrated circuit modules 120 were mounted on each other to form the die stack 182. In further embodiments, die other than integrated circuit modules 120 may be included in stack 182.

Figure 15:
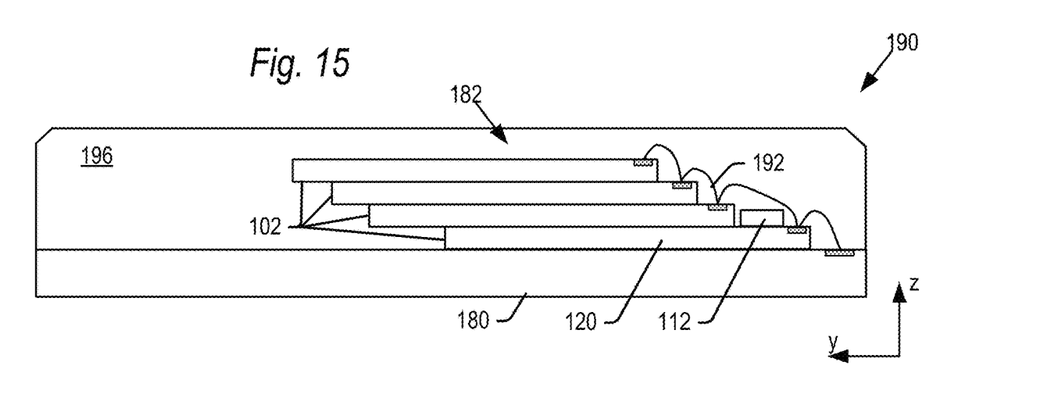

For example, FIG. 15 shows an embodiment where stack 182 comprises an integrated circuit module 120, and then additional individual semiconductor dies, which in embodiments may be first dies 102 including memory cell arrays. In this embodiment, the single second die 112 shown may include a logic circuit which controls the transfer of data and commands to/from just its associated first die 102, or each of the first dies 102 shown in the die stack 182.

In the embodiment of FIG. 15, the die 102 mounted on the memory module 120 may be offset by an amount to leave space for the die bond pads 106 and second die 112 as described above. The remaining dies 102 may be offset on the bottom individual first die 102 by an amount to leave space for the die bond pads 106. The embodiment shown includes one integrated memory module 120 and three individual first dies 102. However, it is understood that there may be multiple integrated memory modules 120 mixed with one or more other individual semiconductor die. The integrated memory module(s) 120 need not be on the bottom of the stack 182 in further embodiments.

Figure 16:
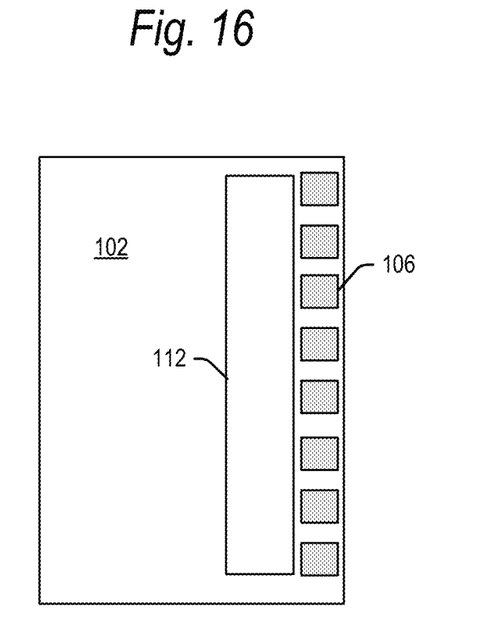
FIGS. 16-19 are top and edge views of integrated memory modules according to alternative embodiments of the present technology.

As noted above, the sizes of the first and second dies 102, 112 may vary with respect to each other. FIG. 5 shows an example where the length and width of the second die 112 are significantly smaller than the first die 102. FIG. 16 shows a further example where a length of the second die 112 is the only slightly smaller than the length of the first die 102. The second semiconductor 112 die may have the same length as the first semiconductor die 102 in further embodiments.

Figure 17:
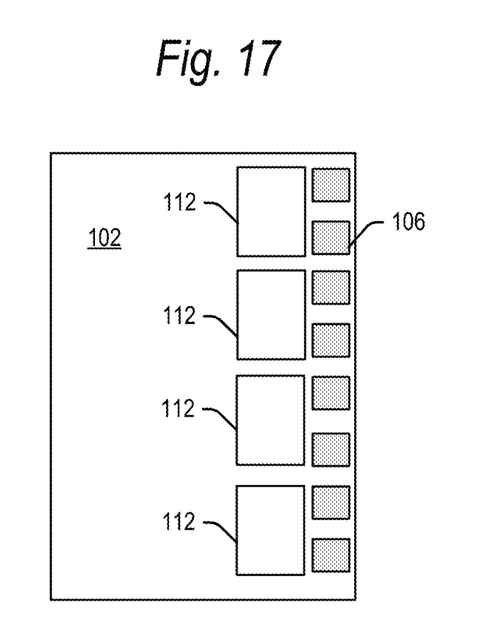

FIG. 17 shows a further embodiment where multiple smaller second die 112 are mounted on the surface of the first die 102. The example shows four such second dies 112, but there may be more or less than four second dies 112 in further embodiments. It is conceivable that the multiple second dies 112 shown in FIG. 17 be used to control transfer of data and commands to the multiple first die 102 shown in the embodiment of FIG. 15.

Figure 18:
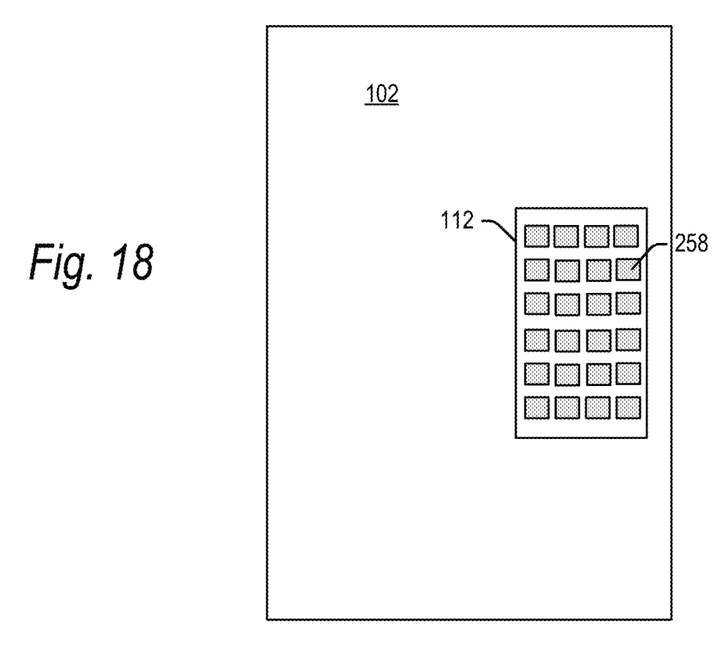
Figure 19:
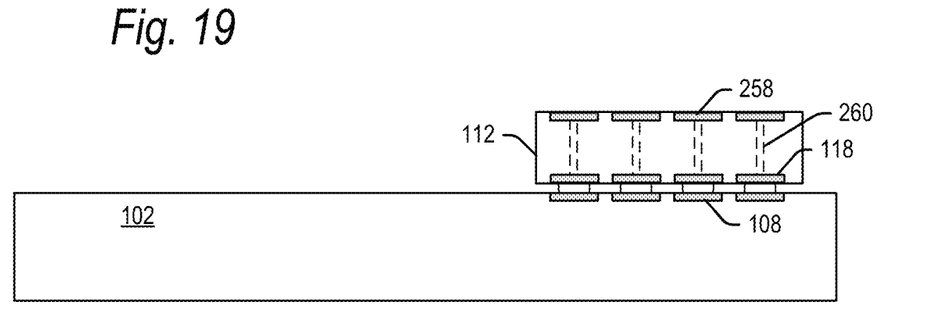

FIGS. 18 and 19 show top and edge views of a further embodiment of the present technology where bond pads 106 on die 102 are omitted. In this embodiment, a pattern of die bond pads 258 are provided on a top surface of the second die 112. These bond pads 258 may be electrically connected to the pattern of die bond pads 118 on the opposite side of the second die 112 by TSVs 260. The bond pads 118 may be flip-chip bonded to bond pads 108 on the first die 102 as described above. The particular pattern of bond pads 258 are by way of example only, and may vary in further embodiments.

Figure 20:
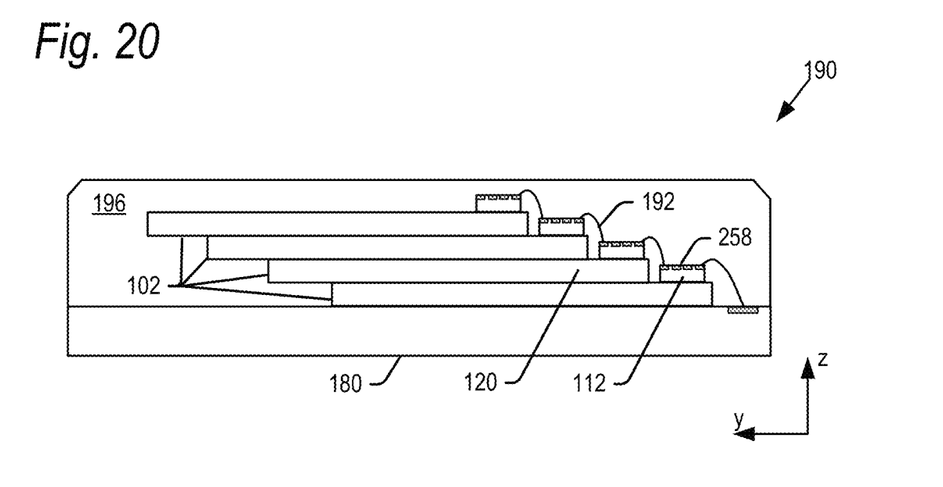
FIGS. 20-21 are edge views of semiconductor devices according to further alternative embodiments of the present technology.

FIG. 20 shows an edge view of an example of a semiconductor device 190 including a number of stacked integrated memory modules 120 including second dies 112 with TSVs 260 as shown in FIGS. 18 and 19. The memory modules 120 of FIG. 20 may be electrically interconnected to each other and the substrate 180 using the die bond pads 258 on the second dies 112 of each memory module 120. The die bond pads 258 provide access to both the first and second dies 102, 112 in each memory module 120, as well as electrically interconnecting the memory modules 120 to each other and the substrate 180.

Figure 21:
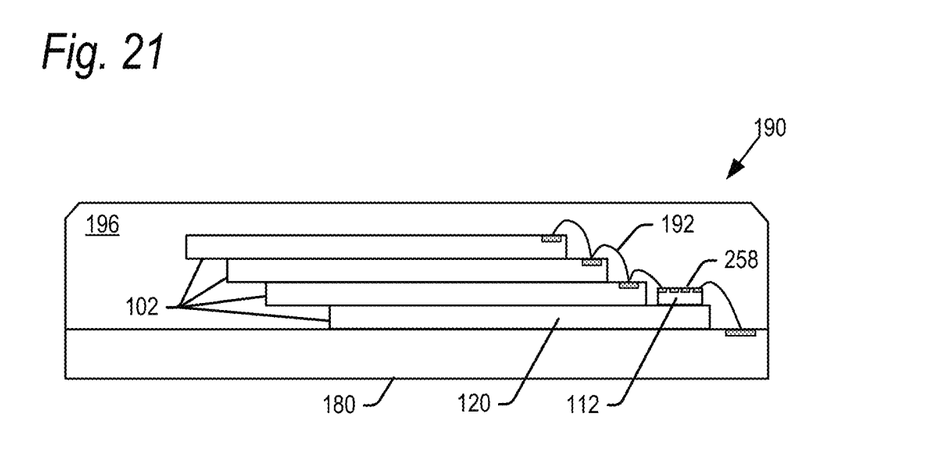

FIG. 21 shows an edge view of a semiconductor device 190 similar to that of FIG. 20, but the embodiment of FIG. 21 includes a single memory module 120 having a second die 112 with TSVs 260 as shown in FIGS. 18 and 19. The remaining semiconductor die in the device 190 of FIG. 21 are individual semiconductor dies, which in embodiments may be first dies 102 including memory cell arrays. In this embodiment, the single second die 112 shown may include a logic circuit which controls the transfer of data and commands to/from just its associated first die 102, or each of the first dies 102 shown in the die stack 182.

In the embodiment of FIG. 21, the die 102 mounted on the memory module 120 may be offset by an amount sufficient to leave space for second die 112. The remaining dies 102 may be offset on the bottom individual first die 102 by an amount to leave space for the die bond pads 106. The embodiment shown includes one integrated memory module 120 and three individual first dies 102. However, it is understood that there may be multiple integrated memory modules 120 mixed with one or more other individual semiconductor die. The integrated memory module(s) 120 need not be on the bottom of the stack 182 in further embodiments.

In summary, an example of the present technology relates to an integrated memory module comprising: a first semiconductor die; a second semiconductor die flip-chip bonded to a surface of the first semiconductor die to electrically and physically couple the second semiconductor die to the first semiconductor die; wherein the first and second coupled semiconductor dies together are configured as an integrated memory.

In another example, the present technology relates to A semiconductor device, comprising: a substrate; a first integrated memory module affixed to the substrate, comprising: a first semiconductor die including a surface having a plurality of die bond pads; a second semiconductor die bonded to the surface of the first semiconductor die adjacent the plurality of die bond pads; wherein the first and second coupled semiconductor dies together are configured as an integrated memory; and a third semiconductor die, mounted on the surface of the first semiconductor die, adjacent the second semiconductor die.

In a further example, the present technology relates to a semiconductor device, comprising: a substrate; a first integrated memory module affixed to the substrate, comprising: a first semiconductor die including a surface having a first plurality of die bond pads; a second semiconductor die bonded to the surface of the first semiconductor die adjacent the plurality of die bond pads; wherein the first and second coupled semiconductor dies together are configured as an integrated memory; a third semiconductor die, mounted to the first integrated memory module, adjacent the second semiconductor die, the third semiconductor die comprising a second plurality of die bond pads; and wire bonds connected between the first and second pluralities of die bond pads, the wire bonds extending over the second semiconductor die.

In another example, the present technology relates to an integrated memory module comprising: a first semiconductor die comprising memory means; a second semiconductor die comprising control means, the second semiconductor die flip-chip bonded to a surface of the first semiconductor die to electrically and physically couple the second semiconductor die to the first semiconductor die; wherein the first and second coupled semiconductor dies together are configured as an integrated memory.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. An integrated memory module comprising:
   a first semiconductor die;
   a second semiconductor die flip-chip bonded to a surface of the first semiconductor die to electrically and physically couple the second semiconductor die to the first semiconductor die;
   wherein the first and second coupled semiconductor dies together are configured as an integrated memory.

2. The integrated memory module of claim 1, wherein the first semiconductor die comprises a plurality of memory cells.

3. The integrated memory module of claim 2, wherein the second semiconductor die comprises a control circuit for controlling access of the plurality of memory cells.

4. The integrated memory module of claim 3, wherein the control circuit comprises a complementary metal—oxide—semiconductor integrated circuit.

5. The integrated memory module of claim 1, wherein the first and second dies together are configured as a nonvolatile memory device.

6. The integrated memory module of claim 5, wherein the nonvolatile memory device comprises one of a NAND flash memory device, a Magnetic random access memory (RAM) device, a Phase Change RAM device and a resistive RAM device.

7. The integrated memory module of claim 1, wherein the first semiconductor die comprises a plurality of bonding pads configured to wire bond the first semiconductor die.

8. The integrated memory module of claim 1, wherein the integrated memory module has a footprint equal to a footprint of the first semiconductor die.

9. The integrated memory module of claim 8, wherein the second semiconductor die is smaller than the first semiconductor die.

10. The integrated memory module of claim 1, wherein the second semiconductor die includes a first group of bond pads, on a first surface of the second semiconductor die adjacent the first semiconductor die, for flip-chip bonding of the second semiconductor die to the first semiconductor die.

11. The integrated memory module of claim 10, further comprising a second set of bond pads on a second surface of the first semiconductor die opposite the first surface.

12. A semiconductor device, comprising:
   a substrate;
   a first integrated memory module affixed to the substrate, comprising:
      a first semiconductor die including a surface having a plurality of die bond pads;
      a second semiconductor die bonded to the surface of the first semiconductor die adjacent the plurality of die bond pads;
      wherein the first and second coupled semiconductor dies together are configured as an integrated memory.

13. The semiconductor device of claim 12, further comprising a third semiconductor die, mounted on the surface of the first semiconductor die, adjacent the second semiconductor die.

14. The semiconductor device of claim 13, wherein the third semiconductor die comprises a memory die.

15. The semiconductor device of claim 13, wherein the third semiconductor die comprises a plurality of memory cells, the semiconductor device further comprising a fourth semiconductor die bonded to the surface of the third semiconductor, wherein the third and fourth coupled semiconductor dies together are configured as an integrated memory.

16. The semiconductor device of claim 15, wherein the fourth semiconductor die is flip-chip bonded to the third semiconductor die.

17. The semiconductor device of claim 15, wherein the fourth semiconductor die is electrically connected to the third semiconductor die using through silicon vias.

18. The semiconductor device of claim 12, further comprising a wire bond extending between a contact pad on the substrate and a die bond pad on the first semiconductor die.

19. The semiconductor device of claim 12, further comprising a wire bond extending between a contact pad on the substrate and a die bond pad on the second semiconductor die.

20. A semiconductor device, comprising:
   a substrate;
   a first integrated memory module affixed to the substrate, comprising:
      a first semiconductor die including a surface having a first plurality of die bond pads;
      a second semiconductor die bonded to the surface of the first semiconductor die adjacent the plurality of die bond pads;
      wherein the first and second coupled semiconductor dies together are configured as an integrated memory;
   a third semiconductor die, mounted to the first integrated memory module, adjacent the second semiconductor die, the third semiconductor die comprising a second plurality of die bond pads; and
   wire bonds connected between the first and second pluralities of die bond pads, the wire bonds extending over the second semiconductor die.

21. The semiconductor device of claim 20, wherein the third semiconductor die is mounted on the first surface of the first semiconductor die.

22. The semiconductor device of claim 20, wherein the third semiconductor die is mounted on a surface of the second semiconductor die.

23. The semiconductor device of claim 20, wherein the third semiconductor die comprises a memory die.

24. The semiconductor device of claim 20, wherein the third semiconductor die comprises a plurality of memory cells, the semiconductor device further comprising a fourth semiconductor die bonded to the surface of the third semiconductor, wherein the third and fourth coupled semiconductor dies together are configured as an integrated memory.

25. The semiconductor device of claim 24, wherein the fourth semiconductor die is flip-chip bonded to the third semiconductor die.

26. An integrated memory module comprising:
   a first semiconductor die comprising memory means;
   a second semiconductor die comprising logic circuit means, the second semiconductor die flip-chip bonded to a surface of the first semiconductor die to electrically and physically couple the second semiconductor die to the first semiconductor die;
   wherein the first and second coupled semiconductor dies together are configured as an integrated memory.

* * * * *